(12) United States Patent
Ng et al.

(10) Patent No.: US 10,475,690 B2
(45) Date of Patent: Nov. 12, 2019

(54) APPARATUS AND METHOD FOR AUTOMATICALLY SETTING, CALIBRATING AND MONITORING OR MEASURING PICKUP HEAD POSITION AND FORCE DURING COMPONENT PICKUP OPERATIONS

(71) Applicant: Semiconductor Technologies and Instruments Pte Ltd, Singapore (SG)

(72) Inventors: Lian Seng Ng, Singapore (SG); Lian Aik Tan, Singapore (SG); Mun Fai Lye, Singapore (SG)

(73) Assignee: SEMICONDUCTOR TECHNOLOGIES & INSTRUMENTS PTE. LTD., Singapore (SG)

( * ) Notice: Subject to any disclaimer, the term of this patent is extended or adjusted under 35 U.S.C. 154(b) by 180 days.

(21) Appl. No.: 15/619,585

(22) Filed: Jun. 12, 2017

(65) Prior Publication Data
US 2017/0365501 A1 Dec. 21, 2017

Related U.S. Application Data

(60) Provisional application No. 62/350,685, filed on Jun. 15, 2016.

(51) Int. Cl.
*G06F 19/00* (2018.01)
*H01L 21/683* (2006.01)
(Continued)

(52) U.S. Cl.
CPC ........ *H01L 21/6838* (2013.01); *G01L 27/002* (2013.01); *H01L 21/67144* (2013.01); *G01L 21/00* (2013.01)

(58) Field of Classification Search
CPC .... H01L 21/6838; G01L 27/002; G01L 21/00
(Continued)

(56) References Cited

U.S. PATENT DOCUMENTS 5,500,589 A * 3/1996 Sumcad ................. G01R 33/00
324/202
9,778,131 B2 * 10/2017 Everett .................... G01L 25/00
(Continued)

*Primary Examiner* — Ronnie M Mancho
(74) *Attorney, Agent, or Firm* — Horizon IP Pte Ltd.

(57) ABSTRACT

A system is disclosed for calibrating the compressive forces exerted on a component during a component retrieval process from a carrier or support surface by a component handling device. The system includes a sensor, a component pickup assembly having a reference structure, a housing and a spring guide holder coupled to a suction tip. A resilient member may reside within the housing and the reference structure such that the spring guide holder and the housing are spaced from each other to define a variable first gap thereinbetween. A gate is formed by the reference structure and a sheath located on the housing whereby the reference structure is spaced from the housing to define a variable second gap thereinbetween. A detection structure is located within the variable second gap such that the sensor is able to detect portions of the detection structure. The detected portion of the detection structure or element at the second gap size is correlated to the height of the variable first gap and the height of the variable first gap is correlated to a reference predetermined threshold compressive force exerted on the component by the resilient member.

20 Claims, 9 Drawing Sheets

(51) Int. Cl.
  *G01L 27/00* (2006.01)
  *H01L 21/67* (2006.01)
  *G01L 21/00* (2006.01)

(58) Field of Classification Search
  USPC ................................................ 700/245, 254
  See application file for complete search history.

(56) References Cited

U.S. PATENT DOCUMENTS

| | | | |
|---|---|---|---|
| 2006/0166371 A1* | 7/2006 | Testa | B01L 3/508 |
| | | | 436/174 |
| 2011/0166824 A1* | 7/2011 | Haisty | G01B 5/12 |
| | | | 702/157 |
| 2013/0204157 A1* | 8/2013 | Clark | A61F 2/4657 |
| | | | 600/547 |
| 2015/0070330 A1* | 3/2015 | Stern | G06F 3/03545 |
| | | | 345/179 |
| 2015/0328497 A1* | 11/2015 | Doucot | A63B 23/08 |
| | | | 482/146 |
| 2016/0237759 A1* | 8/2016 | Li-Leger | E21B 47/01 |

* cited by examiner

APPARATUS AND METHOD FOR AUTOMATICALLY SETTING, CALIBRATING AND MONITORING OR MEASURING PICKUP HEAD POSITION AND FORCE DURING COMPONENT PICKUP OPERATIONS

TECHNICAL FIELD

The present disclosure relates generally to a semiconductor component handling device for picking and placing objects such as semiconductor components. More specifically, aspects of the present disclosure are directed to a system, apparatus, device, and process for automatically setting the force exerted by a pickup head on a component, for instance, on a dynamic or near real-time basis during component pickup operations by a component handling system and/or automatically calibrating and monitoring, measuring, and/or adjusting the travel (e.g., vertical travel) of one or more pickup heads of the component handling system, apparatus, or device.

BACKGROUND

Semiconductor Integrated Circuits (ICs) are generally fabricated in wafer form or in package form. After the fabrication process, each wafer or package is typically singulated into multiple components. The components can include semiconductor dies or plastic packages such as quad flat no lead (QFN), Chip Scale (CSP), or ball grid array (BGA) packages. The semiconductor components typically undergo numerous processing steps including inspection, testing, and handling processes before they are ready to be packaged and distributed from a semiconductor fabrication facility to other destinations, e.g., for subsequent sale.

Each processing step generally occurs at a distinct or different processing station or module. Typically, the semiconductor component is first retrieved by a component handling device at or from a first or current station, and transferred and thereafter deposited or detached at a second or next station. Semiconductor components are processed at the processing stations either while in motion or while temporarily stationary at the processing stations, depending on processing requirements. The manner in which components are retrieved, handled, and deposited from one processing station to another plays a critical role in ensuring that the components are not damaged, more so when semiconductor component handling operations are automated in a compact space and in a high speed environment.

Existing component handling devices for transferring semiconductor components can include, for example, a robotic assembly or rotatable assembly or any other pick-and-place system well known in the art. Various types of component handling devices have multiple component pickup head assemblies or mechanisms, which can also be referred to as component pickup heads or component handlers for retrieving, receiving, holding, and transferring components. Generally, semiconductor components that have been retrieved or received and are held by the pickup head(s) are transferred between and positioned at different processing stations by way of the pickup head(s) as displacement of the pickup head(s) occurs along a predetermined travel profile or path.

Typically, a pickup head must be precisely or very precisely positioned over a pickup surface (e.g., a component top surface, bottom surface, or side surface) of each component requiring transfer on a repeated, successive, or ongoing basis in order to ensure that component pickup operations occur in a consistent, predictable, and error-free manner. Moreover, the force that the pickup head exerts on the components retrieved thereby must be (a) sufficiently large to ensure that components are securely and reliably held or retained by the pickup head and (b) sufficiently small to minimize the likelihood of component damage. Minimizing the likelihood of component damage can be particularly important in component pickup situations involving fragile components (e.g., thin or very thin semiconductor die), especially when the economic cost or value of each fragile component at the manufacturing stage during which component pickup occurs is non-trivial or significant (e.g., after multiple or many complex component fabrication processes or steps have already been performed).

A component pickup head is commonly used in association with or includes a soft or deformable tip element, which can be a replaceable element that is attached to a predetermined end of the component pickup head at which components are retrieved, and which comes into contact with each component as part of the component retrieval or pickup process. Tip elements can deteriorate or degrade over time as a result of successive component pickup operations, and thus the length or height of a tip element can become smaller over time. Consequently, the precision and reliability of component pickup operations can deteriorate or degrade over time because the vertical distance between the distal end of the tip element and component pickup surfaces can increase over time, possibly in a non-uniform or less than readily predictable manner.

In some types of component pickup situations, for instance, when semiconductor die reside on or are adhered to a deformable (e.g., vertically deformable) surface such as a conventional tape carried by a film frame, the pickup head is configured such that the tip element engages with and intentionally slightly presses against the pickup surface of each component while the component resides on the tape, to thereby exert an intended amount of downward compressive force on the component pickup surface in order to provide an adequate grip for consistently overcoming the adhesive force holding the component on the tape and picking up or removing components from the tape. In such situations, the component can be damaged if there is excessive force exerted on the component pickup surface when the pickup head is pressed thereon or thereagainst. This compressive force can be established in accordance with a predetermined target compressive force level depending on the type and thickness of semiconductor components under consideration. However, in conventional component handling systems, apparatuses, and devices, precise calibration, measurement, adjustment, and monitoring of compressive forces applied to components are difficult to achieve and practically infeasible, particularly due to the small, compact nature of the pickup heads and the highly confined spaces in which the component handling devices operate.

In view of the foregoing, in order to properly and consistently retrieve the semiconductor components in a safe or damage-free manner, the position and vertical travel of the pickup head(s) need to be precisely calibrated prior to the initiation of regular, sustained, ongoing, or post-calibration component pickup operations. This calibration is typically performed manually by a technician. However, the manual process pickup head calibration process involves a significant amount of time, adversely affecting throughput; as well as a great deal of trial and error, which is prone to human error and which leads to insufficiently reliable or inconsistent component pickup, and/or inadequate or excessive compressive force applied to the semiconductor components during the post-calibration component retrieval operations. In addition, there are no existing devices or mechanisms for determining or monitoring the compressive force(s) exerted on components during component handling device operation.

Accordingly, in order to address or alleviate the aforementioned problems and/or disadvantages associated with conventional component handling devices, there is a need for a system, apparatus, device, and process for automatically setting an intended compression threshold to prevent the pickup head(s) from inadequately or excessively pressing onto the semiconductor components during component retrieval operations and/or automatically precisely calibrating the travel (e.g., vertical travel) of component pickup head(s) to component pickup surfaces, and which can facilitate or enable monitoring or measurement of pickup head performance and component pickup consistency over time.

SUMMARY

According to various embodiments of the present disclosure, a system, apparatus, device, and process are disclosed for automatically setting the force exerted by a pickup head on a component, for instance, on a dynamic or near real-time basis during component pickup operations by a component handling system and/or automatically calibrating and monitoring, measuring, and/or adjusting the travel of one or more pickup heads of the component handling system, apparatus, or device.

In various embodiments, the system may include a sensor, a component pickup assembly having a reference structure such as a vacuum cap, a housing and a spring guide holder which is coupled to a suction tip. A resilient member such as a spring may reside within the housing and the reference structure such that the spring guide holder and the housing are spaced from each other to define a variable first gap therebetween. A gate may be formed by the reference structure and a sheath located on the housing such that the reference structure may be spaced from the housing to define a variable second gap therebetween. Further, a detection structure or element may be located within the variable second gap such that the sensor may be able to detect portions of the detection structure or element. The detected portion of the detection structure or element at the second gap size may be correlated to the height of the variable first gap and the height of the variable first gap may be correlated to a reference predetermined threshold compressive force exerted on the component by the resilient member.

In one aspect of the disclosure, the sensor may include a laser sensor or an image capture device adjustably mated to a structure of the component handling device.

In one aspect of the disclosure, the reference structure may include a reference border or structure of the component pickup assembly including a predetermined border, edge, or rim structure or section of a vacuum cap of the component pickup assembly.

In one aspect of the disclosure, the suction tip may be mated to the spring guide holder such that the tip element may be resiliently slidable along a longitudinal axis of the housing for exerting a predetermined compressive force on the component that may be residing on a carrier or support surface.

In one aspect of the disclosure, the sheath blocks or partially blocks illumination directed to and reflected from the detection structure from/to the sensor when the sheath is in the way of the line of sight or field of view of the optical travel path of the sensor.

In one aspect of the disclosure, the amount or intensity of illumination reflected from the detection structure and detected by the sensor may be correlated to the size, dimensions or height of the variable second gap when the detection structure is a reflector and the sensor is a laser sensor.

In one aspect of the disclosure, the indicia carried by the detection structure and captured by the sensor may be correlated to the size, dimensions or height of the variable second gap when the detection structure is a calibrated marker which may include a reflective polycarbonate material and the sensor is an image capture device.

In one aspect of the disclosure, the initial height of the variable first gap is calibrated when the component pickup assembly is at an initial calibrated position, such that the initial calibrated position of the component pickup assembly is in a closest spatial relationship with the predetermined position of the pickup surface of the component.

In one aspect of the disclosure, the sheath may act as a gate for providing: (i) a fully closed variable second gap position such that the sensor is unable detect the detection structure; (ii) a range of partially open variable second gap positions such that the sensor may be able to detect portions of the detection structure; and (iii) a fully open variable second gap position such that the sensor is able detect a maximum portion of the detection structure. In this way, the opening of the gate from a closed position to a fully open position, corresponding to the second gap height, may be established to correspond with an allowable or acceptable first gap height.

In one aspect of the disclosure, the spring is not compressed when the gate corresponding to the variable second gap is in the fully closed position, such that no compressive forces may be exerted on the component by the spring.

In one aspect of the disclosure, the spring is not compressible to absorb the excess force exerted on the component when the gate is in the fully open position.

In one aspect of the disclosure, the sensor may be communicatively linked to a controller for computing the compressive force exerted on a component corresponding to the variable first gap height by way of image processing operations based on an analysis of the intensity of the illumination or size, dimension or height of the detection structure captured by the sensor.

In one aspect of the disclosure, the controller may further be configured to provide an auto-calibration mechanism to: (i) position the component pickup assembly within an accuracy of one micron of the initial calibrated position; and (ii) dynamically adjust the position of the vertical travel of the component pickup assembly such that the component pickup assembly may be (a) maintained within a predetermined vertical travel range during component pickup operations; and (b) prevented from pressing excessively onto the component during the component pickup process.

In one embodiment, a method of calibrating the compressive forces exerted on a component during a component retrieval process from a carrier or support surface by a component handling device is disclosed. The method may include the steps of: linking a sensor to a controller; providing a component pickup assembly including a reference structure, a housing, and a spring guide holder coupled to a suction tip and a resilient member residing within the housing and reference structure; spacing the spring guide holder and the housing from each other to define a variable first gap therebetween; forming a gate formed by the reference structure and a sheath located on the housing; spacing the reference structure from the housing to define a variable second gap therebetween; providing a detection structure located within the variable second gap by which the sensor may be able to detect portions of the detection structure; correlating a detected portion of the detection structure at the second gap size to the height of the variable first gap; such that the height of the variable first gap may be correlated to a predetermined threshold compressive force exerted on the component.

In one aspect of the disclosure, the method may further include an automatic calibrating method of setting the initial position of the component pickup assembly. Such a method may include the steps of: moving the component pickup assembly of the component handling device to dispose the component pickup assembly at a predetermined initial component handling device height by the controller; activating the sensor; moving the component pickup assembly downwardly in first incremental pulses until the sensor detects the detection structure; registering a first component pickup assembly height; moving the component pickup assembly upwardly in first incremental pulses; moving the component pickup assembly downwardly in second incremental pulses until the sensor detects the detection structure; registering a second component pickup assembly height; moving the component pickup assembly upwardly in second incremental pulses; and establishing a calibrated component pickup assembly height including the first and second component pickup assembly heights by the controller, such that the first and second component pickup assembly heights correspond to a plurality of component pickup assembly heights, and such that the first incremental pulses are greater in magnitude than the second incremental pulses.

In another aspect of the disclosure, the method may further include a method of automatic monitoring, measuring, and adjusting the calibrated position of the component pickup assembly. Such a method may include the steps of: moving the component pickup assembly of the component handling device to dispose the component pickup assembly at a predetermined initial component handling device height by the controller; activating the sensor; moving the component pickup assembly downwardly in first incremental pulses until the sensor detects the detection structure; registering a first component pickup assembly height; moving the component pickup assembly upwardly in first incremental pulses; moving the component pickup assembly downwardly in second incremental pulses until the sensor detects the detection structure; registering a second component pickup assembly height; moving the component pickup assembly upwardly in second incremental pulses; and establishing a calibrated component pickup assembly height comprising the first and second component pickup assembly heights by the controller, such that the first and second component pickup assembly heights correspond to a plurality of component pickup assembly heights, and wherein the first incremental pulses are greater in magnitude than the second incremental pulses.

BRIEF DESCRIPTION OF THE DRAWINGS

Representative embodiments of the present invention are described hereinafter with reference to the figures, in which.

DETAILED DESCRIPTION

Figure 1:
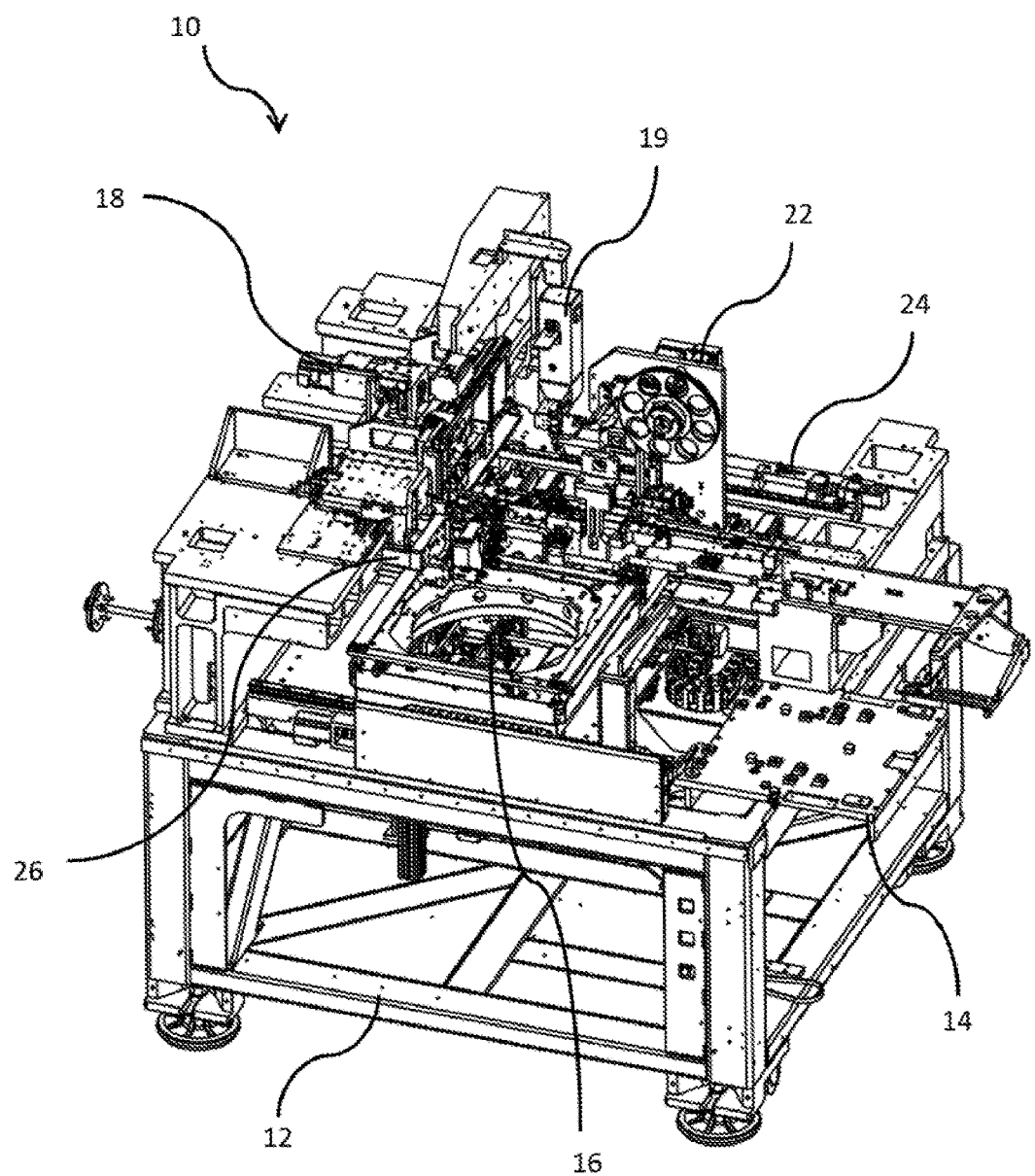
FIG. 1 is a perspective view of a representative semiconductor component processing system.

In the present disclosure, the depiction of a given element or consideration or use of a particular element number in a particular FIG. or a reference thereto in corresponding descriptive material can encompass the same, an equivalent, or an analogous element or element number identified in another FIG. or descriptive material associated therewith. The presence of "/" in a FIG. or text herein is understood to mean "and/or" unless otherwise indicated. The recitation of a particular numerical value or value range herein is understood to include or be a recitation of an approximate numerical value or value range, for instance, within +/−20%, +/−15%, +/−10%, +/−5%, +/−2%, or +/−0%. The term "essentially all" can indicate a percentage greater than or equal to 90%, for instance, 95%, 98%, 99%, or 100%.

As used herein, the term "set" corresponds to or is defined as a non-empty finite organization of elements that mathematically exhibits a cardinality of at least 1 (i.e., a set as defined herein can correspond to a unit, singlet, or single element set, or a multiple element set), in accordance with known mathematical definitions (for instance, in a manner corresponding to that described in *An Introduction to Mathematical Reasoning: Numbers, Sets, and Functions*, "Chapter 11: Properties of Finite Sets" (e.g., as indicated on p. 140), by Peter J. Eccles, Cambridge University Press (1998)). In general, an element of a set can include or be a system, an apparatus, a device, a structure, an object, a process, a physical parameter, or a value depending upon the type of set under consideration.

The representative embodiments in accordance with the present disclosure described herein increase or maximize the likelihood that a set of pickup heads corresponding to an automated component or object handling system, apparatus, or device can consistently, precisely, repeatedly, and securely capture, retrieve, receive, or pickup components or objects (e.g., semiconductor die, or other types of components or other objects) in a predictable and safe or damage-free manner. Various embodiments in accordance with the present disclosure provide an automated or automatic process by which one or more of (a) pickup head displacement or travel (e.g., vertical travel) relative to component pickup surfaces (e.g., a top, bottom, or side surface of each component within a sequence of components) can be precisely calibrated; (b) pickup head displacement or travel relative to component pickup surfaces can be monitored, measured, and adjusted at one or more times or during one or more time periods (e.g., on a periodic, dynamic, or near-real time basis); and (c) compressive forces exerted by a pickup head on components during component pickup operations can be estimated, calculated, or adjusted at one or more times or during one or more time periods (e.g., on a periodic, dynamic, or near-real time basis). Multiple embodiments in accordance with the present disclosure provide an automated process by which insufficient or excessive pickup head displacement or travel relative to a component pickup surface and/or insufficient or excessive compressive forces exerted by a component pickup head on components can be identified, addressed, remedied, or corrected (e.g., by way of electromagnetic signal feedback used by a pickup head displacement control subsystem) during component pickup operations (e.g., on-the-fly during the pickup of a given or each component, or on-the-fly from the pickup of one component to a subsequent, next, or immediately successive component).

In situations in which a pickup head tip element (e.g., a pliable, soft, and/or resiliently deformable tip element, such as a soft polymer or rubber tip element) is configured for exerting an intended or predetermined level or amount of compressive force (e.g., downward compressive force) upon each component's pickup surface to engage the tip element with the pickup surface during an initial portion of a component pickup process or set of component pickup operations (e.g., for instance, when a semiconductor die resides on a deformable or compressible surface such as an adhesive tape supported by a film frame and the pickup head needs to precisely, reliably, and safely apply sufficient suction or vacuum force to each semiconductor die to overcome the adhesive force holding the semiconductor die to the tape). Various embodiments in accordance with the present disclosure reduce the likelihood that the pickup head will exert inadequate or excessive compression force on such components, which can lead to failed/improper retrieval of the components, damage to the components, and/or possibly damage to the pickup head. Embodiments in accordance with the present disclosure automate, simplify, and reduce machine setup time, and reduce, greatly reduce, or eliminate the likelihood of calibration errors, particularly human-caused calibration errors, by providing an automated or automatic calibration of the position of a pickup head relative to component pickup surfaces. Embodiments in accordance with the present disclosure further provide an automatic manner of determining and monitoring a permissible distance range across which the pickup head can compress onto component pickup surfaces with minimal or negligible deviation from an intended, predetermined, or calibrated distance range suitable for picking upon a particular type of component.

FIG. 1 shows a representative embodiment of a system 10 for processing and handling semiconductor components 100 (shown in FIG. 3), which includes multiple processing stations and which can be or is configured for semiconductor component handling, inspection, and testing operations. The system 10 generally includes a support structure 12 for adjustably positioning or disposing the system 10 on a support surface, such as a floor. The support structure 12 typically includes a set of vibration isolators (not shown) mounted therein or thereon for preventing shocks and/or vibrations from impacting the support structure 12 during processing station operations. The system 10 further includes processing stations such as an input station or module 14, an ejection table station or module 16, an input pick-and-place station or module/mechanism 18, a reject pick-and-place station or module 19, a tape and reel station 22, a reject tray station or module 24, and a component handling station 26 that travels between these processing stations for retrieval, transfer, and release or deposition of the components 100 to facilitate or enable component transfer from one processing station to another. The input pick-and-place station and reject pick-and-place station includes a pick-and-place mechanism 30 (shown in FIG. 3).

In a representative embodiment, the component handling station 26 can include or be a robotic assembly that utilizes a suitable physical mechanism configured for operating in accordance with a corresponding physical principal for transporting the components 100. The robotic assembly can include a robotic gripper tool, a suction device, a vacuum device, and/or other suitable device(s). Such a robotic assembly can further include, for example, a controller 28 (shown in FIG. 7) that can further be coupled to a component supply system (not shown) and a component packing system (not shown).

In another representative embodiment, the component handling station 26 includes a rotatable assembly such as a turret (not shown) having multiple pick-and-place mechanisms 30 or component handling devices for receiving, holding, and transferring components 100. Rotation of the turret displaces the pick-and-place mechanisms 30 along a predetermined travel profile or path. Generally, the components 100 received and held by the pick-and-place mechanisms 30 are transferred to be positioned at the different processing stations for processing as the pick-and-place mechanisms 30 are displaced along the predetermined travel profile. Each pick-and-place mechanism 30 or component handler includes a mechanism for picking up, retrieving, or receiving a semiconductor component 100 at a first position, as well as a mechanism for releasing, depositing, or detaching the semiconductor component at a subsequent, next, or second position.

In yet another representative embodiment, the component handling station 26 includes a carriage having a flipper mechanism 31 (shown in FIG. 3), for instance, which is rotatably displaceable about a rotational axis, and which can pick up and rotate, flip, or invert a component 100 in a manner readily understood by individuals having ordinary skill in the relevant art. The flipper mechanism 31 can include a rotatable shaft (not shown) movably coupled to the carriage. The shaft (not shown) can further be coupled to a rotary slide plate 34 (shown in FIG. 3) attached to a pickup head 36 (shown in FIG. 2). The shaft can be rotatable relative the carriage for positioning the pickup head 36 between a first position and a second position for retrieving a component 100 and transferring the component from the first position to the second position, respectively.

The component handling station 26 can further be configured for controllably moving the components 100 in a predetermined or selectable/programmable manner. For instance, the component handling station 26 and the pick-and-place mechanism 30 can include one or more photo sensors (not shown) that are used to detect devices or components, and/or one or more cameras/sensors (not shown) that are operable to focus on devices or components at predetermined locations. The controller 28 can be operable to process data from such photo sensors and/or cameras to place the component handling station 26 over the component or object at a predetermined position. The pick-and-place mechanism 30 is then utilized to pick up the component 100, move it to another predetermined location, and thereafter release the component 100.

For purposes of brevity and clarity, the description of embodiments in accordance with the present disclosure is limited hereinafter to a component handling station 26 having a pick-and-place mechanism 30 corresponding to or forming a portion of a flipper mechanism 31. It will, however, be apparent to a person skilled in the relevant art that such a mechanism as described herein does not preclude the applicability of embodiments in accordance with the present disclosure to other types of component handling stations and/or situations, where fundamental principles among various embodiments in accordance with the present disclosure, such as operational, functional and/or performance characteristics, are desired or required. For example, a system, apparatus, or process in accordance with the present disclosure can be used for precise, reliable, secure, and/or damage free retrieval and handling of other types of components and objects, such as objects for which pickup head(s) travel to component pickup surfaces and/or compressive force(s) applied by the pickup head(s) to component pickup surfaces should or must be precisely controlled and/or monitored or measured.

Figure 2:
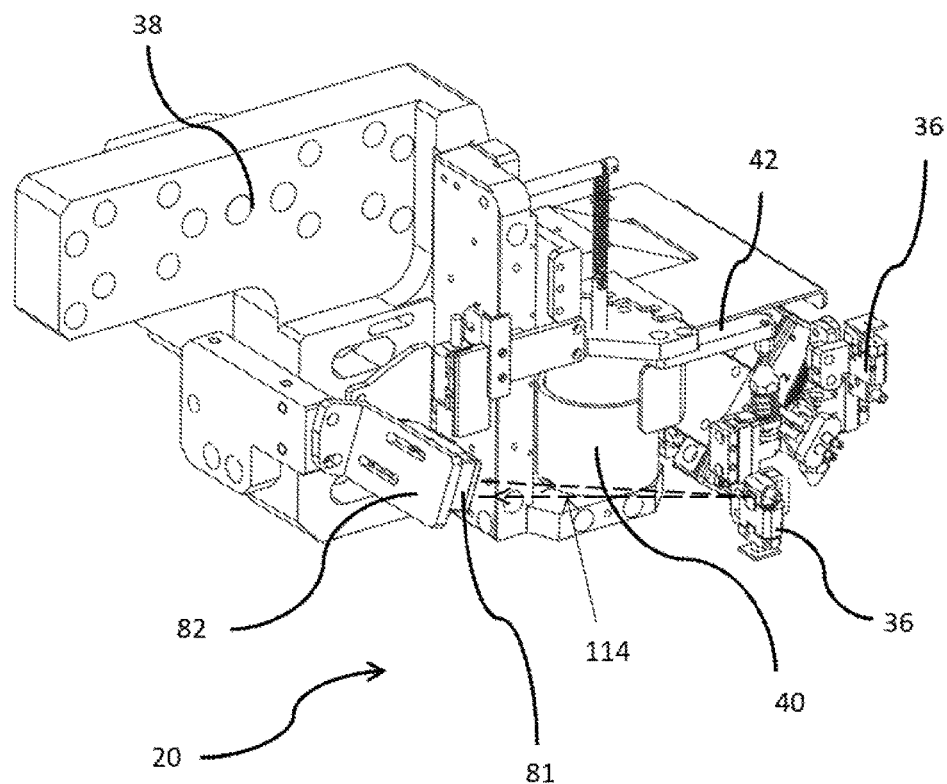
FIG. 2 is a perspective view of a representative semiconductor component handling device having a flipper mechanism, a pickup head, and a compression threshold mechanism in accordance with an embodiment of the present disclosure.

FIG. 2 is a perspective view of a representative semiconductor component handling subsystem, apparatus, or device in accordance with an embodiment of the present disclosure, which includes a flipper mechanism 31; a pick-and-place mechanism 30 having at least one pickup head 36 coupled to the flipper mechanism 31, and a set of pickup operation calibration, monitoring, and/or measurement elements carried out by the pickup head 36; and a sensing subsystem or unit 20. The pickup operation calibration/monitoring/measurement elements and the sensing subsystem 20 facilitate or enable automated calibration, monitoring, measurement, and/or adjustment of pickup head functional, operational, or performance parameters such that component pickup operations can occur in a precise, consistent, and damage free manner. Such pickup head parameters can be correlated with, correspond to, or include pickup head displacement or travel distance relative to a component pickup surface, and/or pickup head compressive force exerted upon a component 100 at one or more times. In such an embodiment, the pick-and-place mechanism 30 can include a main base block 38 to which a linear motor 40 (e.g., a voice coil) and the flipper mechanism 31 are mounted.

Figure 3:
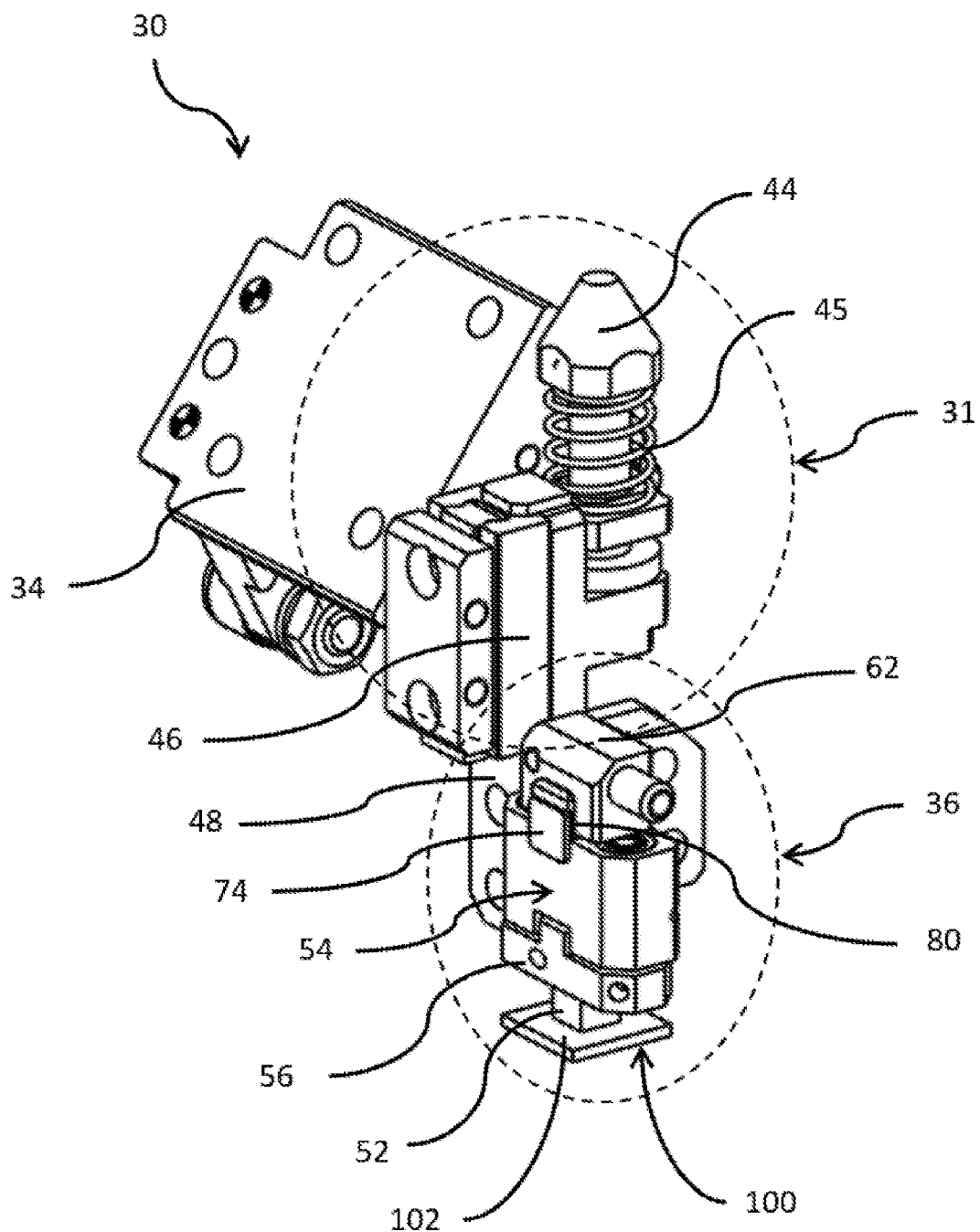
FIG. 3 is a perspective view of the flipper mechanism and pickup mechanism in accordance with an embodiment of the present disclosure.
Figure 5A:
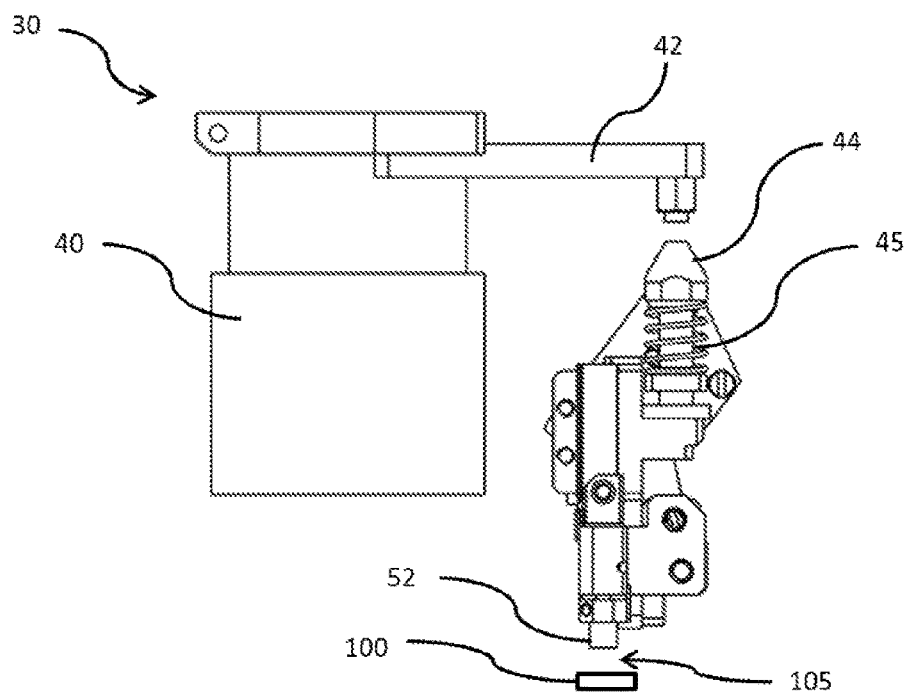
FIGS. 5A-5B are side elevational views of a position of a pusher arm, a Z-shaft, and a pickup head in accordance with an embodiment of the present disclosure.
Figure 5B:
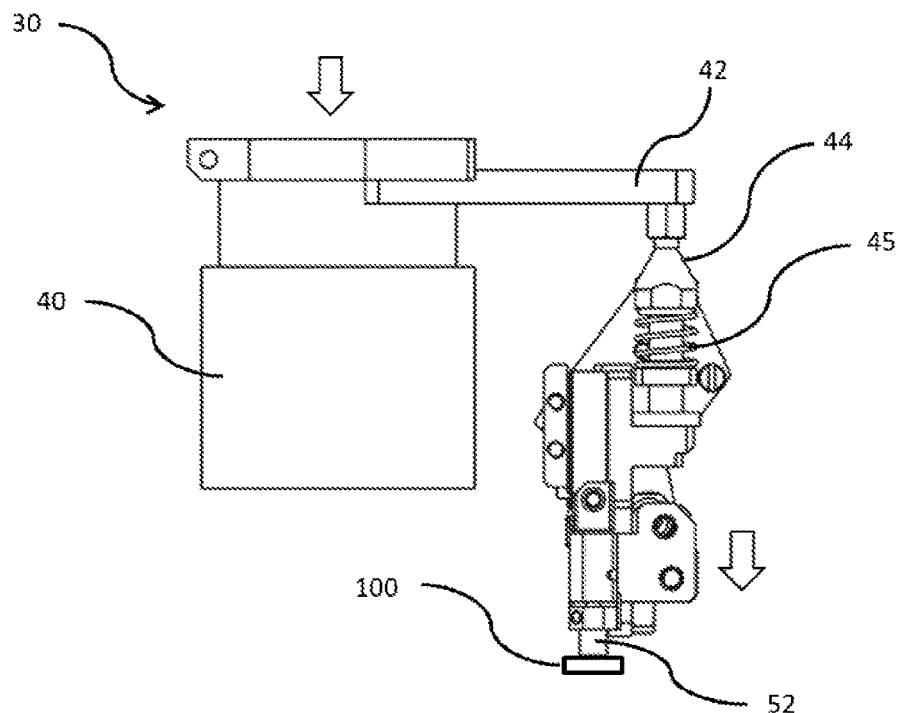
Figure 6A:
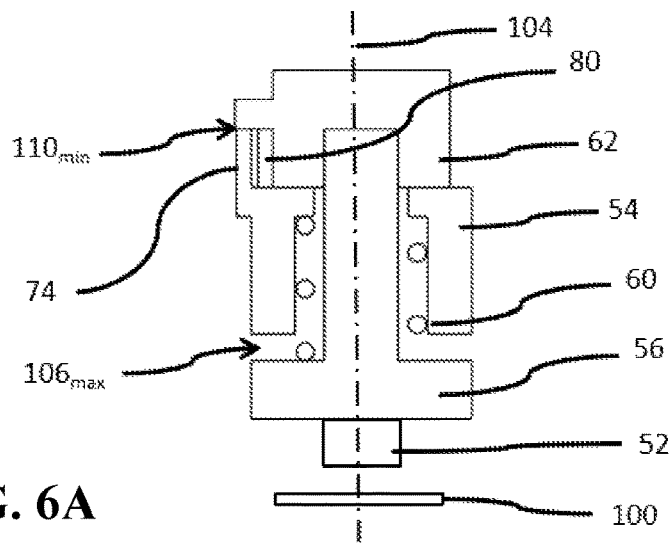
FIGS. 6A-6C are side elevational views showing exposure of a sensor deflector to a laser sensor in relation to a gap height between a housing and a spring guide holder.
Figure 6B:
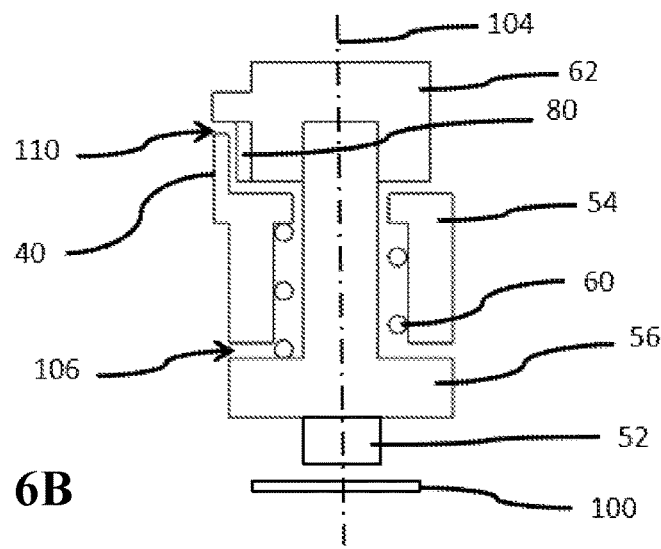
Figure 6C:
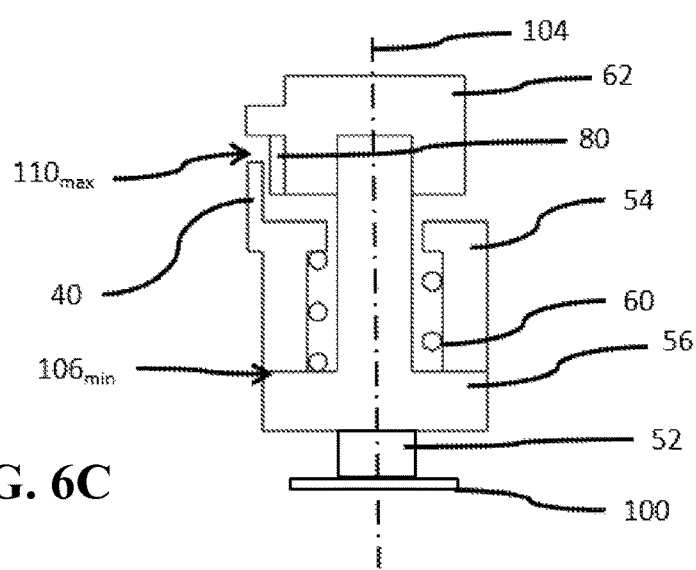

With further reference to FIG. 3, the pick-and-place mechanism 30 can include a rotary slide plate 34 to which the flipper mechanism 31 is rotatably mounted. The pickup head 36 is coupled or attached subjacent to the flipper mechanism 31. The linear motor 40 is coupled to a pusher arm 42 (shown in FIG. 2), which can be positioned over a Z-shaft 44 of the flipper mechanism 31 when the flipper mechanism 31 is in a retrieval position over a component 100, for instance, as shown in FIG. 3 and FIGS. 5A-5B. The pickup head 36 is coupled to the Z-shaft 44 in a slidably displaceable manner, such as by way of a linear slide 46 and a linear slide arm 48 that links the Z-shaft 44 and the pickup head 36, and which is configured for displacement along the linear slide 46. In this way, the linear motor 40 can, via the pusher arm 42, push the spring loaded Z-shaft 44 along an axis (e.g., a Z-axis 104 as shown in FIGS. 6A-6C, or an otherwise-defined axis, in a manner readily understood by individuals having ordinary skill in the relevant art) such that the pickup head 36 can come into close or very close proximity of the pickup surface 102 of the component 100, or press onto the pickup surface 102 of the component 100, for retrieval of the component 100 at an intended or predetermined pickup position. A Z-shaft spring 45 (shown in FIGS. 5A-5B) serves to automatically return the pickup head 36 to its non-pickup position upon retrieval of the component 100. The Z-axis 104 can be a vertical axis, such that the pickup head 36 travels in a vertical down-up motion during a component retrieval process.

Figure 4:
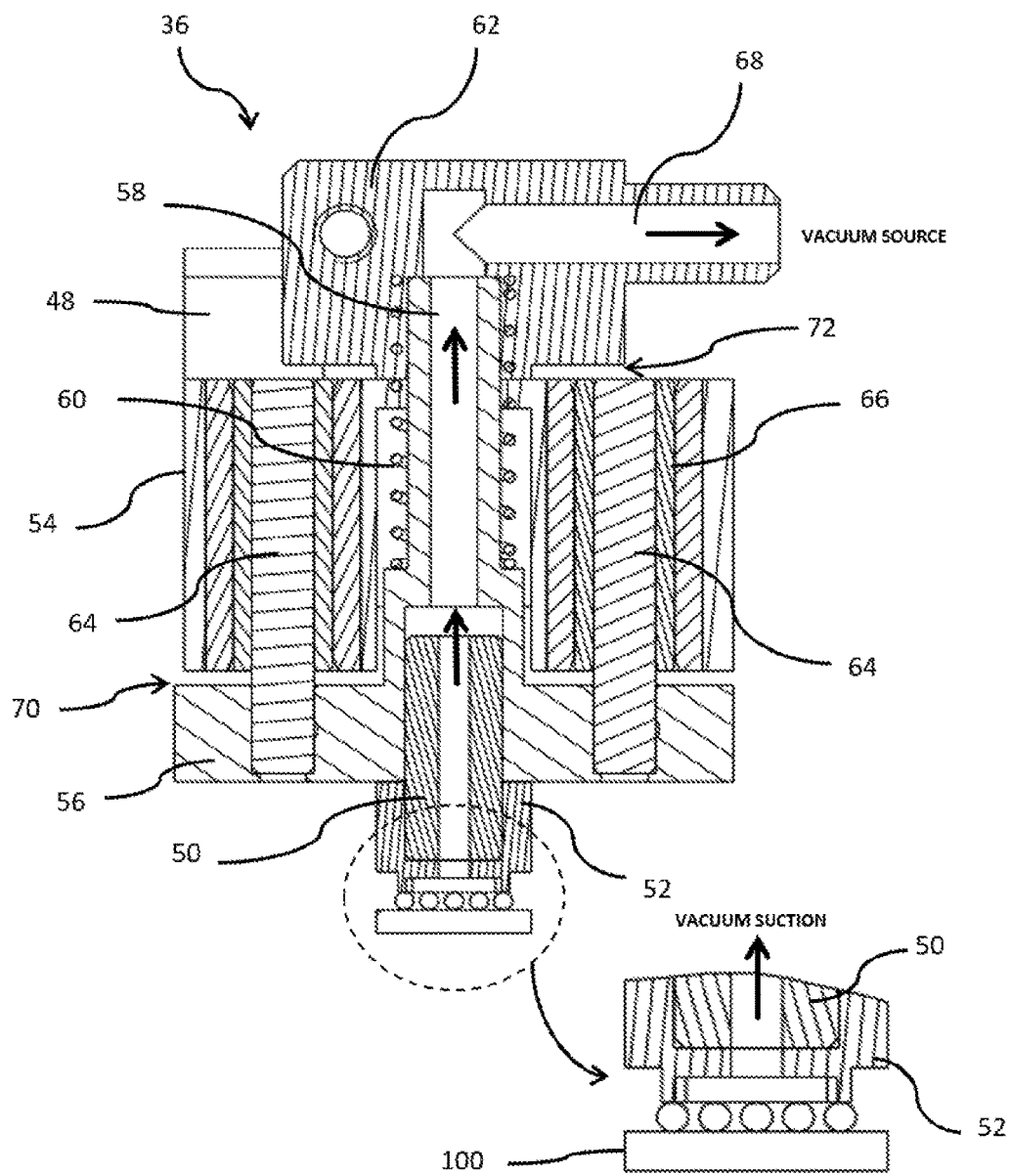
FIG. 4 is a cross-sectional view of the pickup head in accordance with an embodiment of the present disclosure.

FIG. 4 is a cross-sectional view of a pickup head 36 in accordance with an embodiment of the present disclosure. Such a pickup head 36 can include a suction tip holder 50 having a tip element or suction tip 52, for instance, a deformable, pliable, or soft resilient tip (e.g., a rubber tip) configured for engagement with the pickup surface 102 of the component 100 as part of the pickup process. The pickup head 36 can further include a housing 54 to which or wherein a spring guide holder 56 is slidably coupled or attached. This can be achieved by providing a spring loaded hollow shaft 58 within the spring guide holder 56, e.g., the spring guide holder 56 can include a pickup head spring 60 therein, which can be configured for slidable displacement within the housing 54 along an axis that is aligned with or substantially parallel or parallel to the Z-axis 104. The spring loaded hollow shaft 58 can be further detachably mated to a vacuum cap 62, which is in fluid communication with a suction or vacuum source. To aid the sliding action, the housing 54 can further include a pair of guide pins 64 equipped with ball bearing cages 66. By way of such a pickup head structure, the spring guide holder 56 can advantageously compress the pickup head spring 60 upon contact of the suction tip 52 with the component 100 (e.g., corresponding to downward impact of the suction tip 52 on the component pickup surface 102, or upward impact of the component pickup surface 102 on the suction tip 52 in association with engagement of the suction tip 52 with the component pickup surface 102), such that a "cushioning effect" is provided when the suction tip 52 and the component 100 contact and/or exert force on each other, thereby reducing or minimizing the likelihood of component damage (e.g., provided that pickup head displacement relative to the component pickup surface has been properly calibrated).

The suction tip 52 can be shaped and dimensioned for picking up components 100 (e.g., for securely capturing or attaching a semiconductor component or object thereto) at a first or current processing station, and subsequently detaching or releasing the attached component 100 at a second, next, or subsequent processing station. Such a suction tip 52 can be made of a resilient material such as one or more types of plastic or rubber materials, in a manner readily understood by individuals having ordinary skill in the relevant art. The edge or lower border of the suction tip can be configured for providing a good sealing engagement when engaged with a component. As shown in FIG. 4, the suction tip 52 is configured for fluid communication with an air channel or an airway 68 that is fluidically coupled to the vacuum source. Vacuum or suction force is applied by way of the air channel 68 for picking up the component 100. The vacuum source may be able to be communicatively linked to the controller 28 for at least one of setting, controlling and adjusting volume and pressure of air introduced into and out of the channel 68. Control and adjustment of the vacuum or suction force for retrieving, holding, and releasing the component 100 can be provided by the controller 28.

The operation of the vacuum source is such that a signal can be generated to trigger the vacuum source to operate at or provide a positive, zero, or negative pressure based upon the position of the pickup head 36. Typically, it will be apparent to an individual having ordinary skill in the relevant art that a negative vacuum pressure will be activated when the pickup head 36 is disposed at a predetermined component pickup position at which engagement between the suction tip 52 and the component pickup surface 102 is intended to occur by way of (a) activation of the vacuum or suction force such that the vacuum or suction force draws the component 100 upwards toward the suction tip 52 prior to physical contact of the suction tip 52 with the component pickup surface 102; (b) downward compressive contact of the suction tip 52 against the component pickup surface 102 prior to the activation of the vacuum or suction force; or (c) essentially simultaneous activation of the vacuum or suction force with physical contact between the suction tip 52 and the component pickup surface 102.

The use of a vacuum source enables secure retention of the component 100 to the suction tip 52 even at a wide range of speeds of displacement of the pick-and-place mechanism 30 along the predetermined travel profile. Individuals having ordinary skill in the relevant art will understand that alternative designs and structures of the vacuum source can be used for achieving a similar, essentially identical, or identical function without deviating from the scope of the invention.

FIG. 5A illustrates representative positions of the pusher arm 42, z-shaft 44, and suction tip 52 relative to each other at a home position. This home position is the position at which the pickup head is in a ready-for-component-retrieval position, or a ready-for-next-component retrieval position. The home position can be a set of x,y,z coordinates in spatial relationship with the predetermined position of the pickup surface 102 of the component 100 located on the processing station, in a manner readily understood by individuals having ordinary skill in the relevant art.

FIG. 5B illustrates representative positions of the pusher arm 42, z-shaft, and suction tip 52 relative to each other at a "component pickup" position, at which the distal end of the suction tip 52 is disposed within an intended or predetermined distance range or at an intended or predetermined distance from the pickup surface 102 of the component 100 that enables or is expected to enable precise, consistent, and safe component pickup. As part of traveling to the component pickup position, the pickup head 36 is moved downwards, e.g., it is pushed downwards by the pusher arm 42, by a precise distance for purpose of retrieving, receiving, or picking up the component 100. Upon retrieval of the component 100 by way of suction tip 52 engagement with the component pickup surface 102, the pusher arm 42 returns to the home position, and the Z-spring 45 returns the pickup head 36 to the home position.

To enable the pickup head 36 to properly retrieve the component 100, the home position is initially calibrated or set up during a calibration or setup process. From the home position, the pickup head 36 will travel across an intended or predetermined distance 105 (e.g., 3-4 mm in some representative embodiments) to precisely, consistently, and safely retrieve the component 100. The travel distance, throw, or stroke of the pickup head 36 corresponding to the predetermined distance 105 is established to encompass or correspond to an intended safe distance range or distance (e.g., an engagement or engagement force buffering distance) across which the pickup head's spring guide holder 56 can or should travel to provide the aforementioned cushioning effect, by way of which the spring guide holder 56 absorbs at least some force across a small distance range or distance relative to or within which the suction tip 52 can be compressed during its engagement with the component pickup surface 102. As a result, component pickup can occur in a consistent, reliable, and damage limited, essentially damage free, or damage free manner, including in situations in which the suction tip 52 applies a downward compressive force to the component 100 prior to application of the vacuum or suction force to the component pickup surface 102 by way of the vacuum source, such that an intended or desired compressive force (e.g., a target minimum or threshold compressive force, which is less than a target maximum compressive force) can be established to facilitate proper pickup of the component 100. FIG. 5B also shows the position of the rubber tip 52 upon or after contacting the pickup surface 102 of the component 100.

As indicated above, in various pickup head embodiments, the spring guide holder 56 is configured for displacement relative to the housing 54. More particularly, the spring guide holder 56 can be configured for upward displacement toward the housing 54, such that the pickup head spring 60 can absorb or cushion contact or impact forces between the suction tip 52 and the component 100 that occur during engagement therebetween. As further detailed below, the pickup head 36 can be configured to provide a set of gap structures or gaps 70, 72 (shown in FIG. 4) that indicate or define a maximum intended extent or range of spring guide holder 56 displacement relative to the housing 54, and which facilitate or enable the precise calibration, detection, monitoring, and/or measurement of a current spring guide holder displacement relative to the housing by way of optical signal detection and/or image capture operations.

FIG. 6A illustrates a representative position of the pickup head housing 54 relative to the spring guide holder 56 when the pickup head 36 has just vertically transitioned to an outer or upper limit of the component pickup position (or home position) at which component pickup can be initiated, and the suction tip 52 is consequently positioned in very close proximity to the component 100 for purpose of component pickup such that (a) an upwardly directed vacuum or suction force provided by the aforementioned vacuum source can suck or draw the component 100 upwards (e.g., overcoming an opposing downwardly directed vacuum or suction force that retains the component 100 on a carrier or support surface at the component pickup position) to thereby engage the component pickup surface with the suction tip 52; or (b) the suction tip 52 just engages with the pickup surface 102 of the component 100.

FIG. 6B illustrates a representative position of the pickup head housing 54 relative to the spring guide holder 56 during the component retrieval process, at an acceptable or intended pickup head travel position (e.g., vertical travel position) at which consistent, secure, damage free engagement between the distal end of the suction tip 52 and the component pickup surface 102 can occur. At an acceptable or intended pickup head travel position, the pickup head spring 60 exerts a particular amount of force (e.g., downward force) upon the component 100, which can be estimated or calculated (e.g., in accordance with the spring parameters or spring characteristics of the pickup head spring 60), as further detailed below.

FIG. 6C illustrates a representative position of the pickup head housing 54 relative to the spring guide holder 56 just at or beyond a pickup head travel distance 104 (e.g., a vertical pickup head travel distance) at which over-travel of the pickup head 36 exists, and over compression of the component 100 against the suction tip 52 occurs. Such over-travel results in the pickup head housing 54 touching the spring guide holder 56 resulting in an undesirable over-compression condition.

As illustrated in FIG. 4 and FIGS. 6A-6C, various pickup head embodiments in accordance with the present disclosure are structured to provide a first or lower gap 70 between the spring guide holder 56 and the pickup head housing 54; and a second or upper gap 72 between a sheath 74 carried by the pickup head housing 54 and a reference border or structure of the pickup head 36, such as a predetermined border, edge, or rim structure or section of the vacuum cap 62. The first gap 70 can correspond to or define an intended or maximum intended engagement distance or height across which the pickup head's spring guide holder 56 is configured for traveling relative to the housing 54, within or across which (a) secure engagement between the suction tip 52 and the component pickup surface 102 can occur, and (b) the aforementioned cushioning effect can occur. The maximum intended engagement distance can be referred to as a reference maximum gap height or reference maximum height (e.g., which is up to 0.7 mm in some representative embodiments). Displacement of the spring guide holder 56 relative to the pickup head housing 54 causes the first gap 70 to change, such that the first gap 70 decreases as the spring guide holder 56 is displaced upwards toward the housing 54. More particularly, as a result of upward displacement of a lower portion of the spring guide holder 56 to which the suction tip 52 is mounted toward the housing 54, the first gap 70 can be diminished or decreased towards or to a minimum or reference minimum gap height, which can be zero (e.g., approximately 0.0 mm in some representative embodiments). Thus, in various embodiments, the first gap 70 can have an initial height of up to the maximum reference height, which corresponds to zero upward displacement of the spring guide holder 56 toward the housing 54; and a minimum height of as little as 0.0 mm, corresponding to maximum upward displacement of the lower portion of the spring guide holder 56 toward and to the housing 54 (e.g., at which point the spring guide holder 56 and the housing 54 are in contact with each other). Furthermore, the first gap 70 can be established to have a height 106 that can decrease form a calibrated target maximum first gap height $106_{max}$ (which can be up to the reference maximum gap height, i.e., the reference maximum gap height or less than the reference maximum gap height, as illustrated in FIG. 6A) to a calibrated target minimum first gap height $106_{min}$ (which can be as little as 0.0 mm, i.e., a value less than the calibrated target maximum first gap height $106_{max}$, such as 0.1-0.5 mm less than the calibrated target maximum first gap height $106_{max}$, as illustrated in FIG. 6C). Precise, consistent, and damage free component pickup operations are intended, configured, or controlled to occur at pickup head vertical positions between the calibrated target maximum first gap height $106_{max}$ and the calibrated target minimum first gap height $106_{min}$, as illustrated in FIG. 6B.

The second gap 72 has a height that increases from an initial second gap height up to the reference maximum height as the spring guide holder 56 moves relative to the housing 54, e.g., as the lower portion of the spring guide holder 56 is displaced upward. The height of the second gap 70 thus varies inversely relative to or with the current height of the first gap 70 as the lower portion of the spring guide holder 56 is displaced upward towards the housing 54. That is, the second gap height 110 increases while the first gap height 106 decreases as the lower portion of the spring guide holder 56 travels toward the housing 54. The initial second gap height $110_{min}$ can be as small as approximately 0.0 mm.

In various embodiments, the size or height of the second gap 72 corresponds to or defines the size or an illumination reflection and/or detection area, within which a reflector and/or a calibratable or calibrated marker structure 80 resides behind a displaceable sheath 74 that is coupled to or which is formed as a portion of the housing 54, as illustrated in FIGS. 6A-6C. An upper border or edge of the sheath 74 can abut the aforementioned predetermined border, edge, or rim structure or section of the vacuum cap 62 when the first gap height 106 equals the reference maximum height $106_{max}$, i.e., when the initial second gap height $110_{min}$ equals 0.0 mm. Increasing or progressive upward displacement of the lower portion of the spring guide holder 56 toward the housing 54 causes increasing or progressive exposure of the reflector/marker structure 80 from behind the sheath 74. When the second gap 72 has a nonzero height, corresponding to nonzero upward displacement of the spring guide holder 56 toward the housing 54, illumination directed to the reflector/marker 80 travels into and through the second gap 72 along an intended or predetermined optical travel path 114 (shown in FIG. 2), and reflects off of the reflector/marker 80 along the same and/or another intended or predetermined optical travel path 114. Such reflected illumination can be detected by a set of optical sensors 81 (shown in FIG. 2) (e.g., one or more photodetectors and/or an image capture device), for purpose of precisely and reliably calibrating, monitoring, measuring, and/or adjusting the vertical travel or position of the pickup head 36 relative to the pickup surface 102 of a component 100 under consideration. More particularly, the amount or intensity of illumination reflected from the reflector/marker 80 and detected by the sensing subsystem at any given time can be precisely correlated with or indicative of the current size or height of the second gap 72, and thus the current height of the first gap 70, and thus the extent to which or distance across which the spring guide holder 56 has been displaced relative to the housing 54.

In view of the foregoing, in some representative embodiments, upon initial contact between the suction tip 52 and the pickup surface 102 of the component 100, the suction tip 52 can compress or travel and/or the pickup head 36 can travel a further distance of about 0.05-0.35 mm (e.g., about 0.1-0.3 mm). This distance range can result in a suitable, effective, or optimum contact condition whereby the component 100 can be consistently and safely retrieved. Under such a contact condition, the pickup head spring 60 can provide a "cushioning effect" of about 0.1-0.3 mm, and exert a predetermined compressive force, e.g., of less than or equal to 100 gmF, on the pickup surface 102 of the component 100 without damaging the component 100.

In some representative embodiments in accordance with the present disclosure, a predetermined first gap height 106 of 0.1-0.7 mm is calibrated, established, or determined to provide an acceptable, target, or ideal spring guide holder travel range relative to the housing 54 for purpose of maintaining a permissible compression of not more than 100 gmF exerted on the component 100 without damaging the component 100 and/or the pickup head 36. Such a predetermined first gap height 106 of between 0.1-0.7 mm provides a suitable, acceptable, target, or ideal reference or "cushion" or tolerance for the pickup head 36 to safely retrieve the component. However, an individual having ordinary skill in the relevant art will be able to determine an intended or predetermined reference maximum first gap height and corresponding compression force corresponding to different pickup head embodiments, and/or different sizes and types of components to be picked.

In conventional systems, apparatuses, or devices, the home position is calibrated by a technician before the start of the component pickup or retrieval operations. More specifically, the current practice for setting such a home position is to utilise an optical scope to magnify the technician's view of the pick-and-place mechanism 30 and manually position the pickup head 36 whereby the rubber tip 52 can be disposed as close to the surface of the component 100 as possible for component pickup operations. The final home position is then determined by the technician based on a series of manual iterations to determine a best "fit" position. The final home position is intended to correspond to the vertical position at which component pickup can actually occur, whereat the suction tip 52 is disposed closest to the surface of the component 100. However, the process of calibrating this home position involves a great deal of trial and error which may result in inadequate or excessive compressive force on the components 100, which is prone to human error, and which consumes significant amounts of time, adversely affecting manufacturing throughput.

With reference again to FIG. 2, portions of a representative arrangement of an automatic or automated pickup head position calibration, detection, monitoring, measurement, and/or adjustment subsystem or mechanism in accordance with an embodiment of the present disclosure are shown. In various embodiments, the pickup head position calibration, detection, monitoring, measurement, and/or adjustment subsystem or mechanism is based on a sensing subsystem 20 which includes at least one illumination source or device and at least one optical signal detection and/or image capture device. The illumination source or device can include or be a laser, as further detailed below. A suitable sensor 81 can correspondingly include or be a laser sensor adjustably mounted to a bracket 82 (shown in FIG. 2), which can be further attached to an arm or structure of the component handling device or station 26. In some embodiments, the reflector/marker structure 80 includes a reflector made from a suitable reflective material such as a polycarbonate material, which can be coupled or attached to a predetermined portion of the vacuum cap 62 of the pickup head 36, or any other suitable location on the pickup head 36. The reflector can be suitably dimensioned according to the available space and configuration of the location of the reflector. For instance, in some representative embodiments, the reflector can have a width of approximately 10 mm, a height of approximately 2 mm, and a thickness of approximately 0.4-0.5 mm.

The reflector can further be mounted in a face-to-face or optically equivalent orientation with the sensor 81 such that a laser beam can be directed to and from the reflector along a set of predetermined optical travel paths 114, e.g., in a non-interrupted manner during component pickup operations. As shown in the representative embodiment of FIGS. 6A-6C, the reflector can be mounted in such a way that a protrusion of the housing 54 that forms the sheath 74 is provided, such that the sheath 74 at least partially blocks illumination reflected from the laser reflector from the laser sensor when the sheath 74 is in the path of the laser beam. In this way, the sheath 74 acts as a gate for providing a fully closed second gap position (FIG. 6A) whereby the laser sensor is unable detect illumination reflected off of the reflector; a range of partially open positions (e.g., as indicated in FIG. 6B) at which the laser sensor is able to detect at least some light reflected from the reflector; and a fully open position (FIG. 6C) at which the laser sensor is able detect a maximum amount of illumination reflected from the reflector. The opening of the gate from a closed position to a fully open position, corresponding to the second gap height, can be established to correspond with an allowable or acceptable first gap height of 0.1-0.7 mm between the spring guide holder 56 and the housing 54. Likewise, the closing of the gate from an open position to a fully closed position, corresponding to the second gap height, can be established to correspond with an allowable or acceptable first gap height of 0.1-0.7 mm between the spring guide holder 56 and the housing 54.

Additionally or alternatively, the sensor 81 can include a camera such as a video camera adjustably mounted to the same or a different bracket 82, which can be further attached to an arm or structure of the component handling device or station 26. A marker carrying indicia corresponding to the size, dimensions or height of the second gap 72 can be attached to a predetermined portion of the vacuum cap 62 of the pickup head 36 or any other suitable location on the pickup head 36. Such a marker can be suitably dimensioned according to the available space and configuration of the location of the laser camera, in a manner analogous to that for the reflector.

The marker can further be mounted in a face-to-face or optically equivalent orientation with the camera such that the camera line of sight (LOS) or field of view (FOV) can be directed to and from the marker in a non-interrupted manner during component pickup operations. As shown in FIGS. 6A-6C, the marker can be mounted in such a way that a protrusion of the housing 54 that forms a sheath 74 is provided such that the sheath 74 blocks the marker from the camera's view when the sheath 74 is in the path of the laser beam (and/or other illumination source, depending upon embodiment details). In this way, the sheath 74 acts as a gate for providing a fully closed position (FIG. 6A) whereby the camera is unable capture images of the marker; a range of partially open positions (e.g., as indicated in FIG. 6B) relative to which the camera is able to capture images of the marker, depending upon the extent to which the gate is open; and a fully open position (FIG. 6C) at which the camera is able detect a maximum height and area of the marker. The opening of the gate from a closed position to a fully open position can be set at a predetermined length to correspond with an allowable or acceptable first gap height 106 of 0.1-0.7 mm between the spring guide holder 56 and the housing 54.

In the context of a particular non-limiting representative embodiment detailed hereafter to further aid understanding, FIG. 6A shows a starting pickup position or just before the suction tip 52 is in contact with the pickup surface of the component 100. The aforementioned first gap height between the housing 54 and the spring guide holder 56 can be calibrated or set in this position, up to the reference maximum height (e.g., up to a height of 0.7 mm). The pickup head spring 60 is not compressed in this position, and as a result no compressive force is exerted on the component 100 by the pickup head spring in this position. In the representative embodiment shown, the gate is in a fully closed position at this point, and thus the second gap 72 is 0.0 mm. The laser sensor/camera 81 will not be able to detect or capture illumination reflected from the reflector/marker 80 because the gate is presently fully closed.

In the context of this particular non-limiting representative embodiment, FIG. 6B shows a pickup head position when the suction tip 52 is within a target threshold range of or at an expected near ideal position for consistent, secure, and safe component pickup, which can encompass situations in which the suction tip 52 is in compressive contact with the component 100 prior to activation of the vacuum or suction force upon the component 100 through the suction tip 52. Such a suction tip position can correspond to a first gap height 106 of approximately 0.1-0.3 mm between the pickup head spring guide holder 56 and the housing 54 during the retrieval process, in which case the spring 60 is compressed and a near-optimum or optimum compressive force of up to 100 gmF can be safely exerted on the component 100 by the pickup head spring 60 without damaging the component 100. The gate is now in a partially open position, and the second gap 72 has a height that can be given by the reference maximum height minus the current first gap height. The laser sensor/camera 81 is now able to detect illumination reflected from the reflector/marker 80 at such a range of partially open gate positions, and can monitor the first gap height 70 of 0.1-0.3 mm, and/or estimate or calculate the first and/or second gap height based upon the intensity of the illumination reflected from by the reflector and captured by the sensor, as this intensity will be mathematically correlated with height and area of the second gap or gate in a manner readily understood by individuals having ordinary skill in the art.

For the particular non-limiting representative embodiment under consideration, FIG. 6C shows a position corresponding to an over-compression situation, when the suction tip 52 is just at or beyond an over-compression position relative to the component 100. The first gap 70 between the spring guide holder 56 and the housing 54 has a height of 0.0 mm (the spring guide holder 56 and the housing 54 are in contact such that the lower portion of the spring guide holder 56 cannot be further displaced upward towards the housing 54), and the gate is now in a fully open position, or equivalently, the second gap height is equal to the reference maximum height. Because the pickup head spring 60 is no longer compressible to absorb the excess force, this excess force could exceed 100 gmF, which will be exerted on the component 100. The laser sensor/camera 81 is now able to detect a maximum amount or intensity of illumination reflected from the reflector/marker 80 with the gate at the fully open position, such that the controller 28 can indicate an unacceptable second gap height $110_{max}$ which is 0.7 mm or more in this specific representative embodiment.

The laser sensor can be a commercially available multipurpose digital laser sensor suitable for such a purpose, which can include a laser as an illumination source therein. The laser sensor can output at least one area beam, which is least affected by vibrating targets or backgrounds. The laser sensor can utilise a moderately wide or wide laser beam to provide stable detection, even if the sensor reflector position varies. The current or most-recent size of the first gap height 106 is correlated with or estimable or determinable from the amount of light reflected from the reflector, as will be readily understood by individuals having ordinary skill in the relevant art. The laser sensor can be communicatively linked to the controller 28.

The camera can be a commercially available video camera (e.g., a high speed video camera) suitable for such a purpose, and can be communicatively linked to the controller 28. With respect to a sequence of individual video images within a video image sequence or stream, the current or most-recent size of the first gap height 106 can be computed by way of image processing operations based upon an analysis of marker indicia captured by the camera within a captured image that corresponds to a maximum captured second gap size or height during component pickup operations as indicated by the marker indicia, which corresponds to a minimum first gap height 108 during component pickup operations as a result of upward displacement of the lower portion of the spring guide holder 56 toward the housing 54. This maximum captured second gap size or height as indicated by the marker can be correlated with the first gap height, in a manner readily understood by individuals having ordinary skill in the relevant art.

Embodiments in accordance with the present disclosure can be advantageously utilized without technician (human) intervention in at least two ways. The first is to replace the manual calibration process with an automated or automatic calibration process. An auto-calibration mechanism in accordance with the present disclosure can be configured to provide an accurate or highly accurate positioning of the pickup head within approximately 1 micron accuracy of the home position. Such an auto-calibration mechanism eliminates human errors and prolonged setup/calibration times associated with conventional manual pickup head calibration processes. The second is to automatically estimate, determine, monitor, and/or measure the first and/or second gap height corresponding to the maximum extent of displacement of the lower spring guide holder toward the housing, possibly in association with the generation of a feedback control signal applied to the linear motor (e.g., voice coil) such that the position of the vertical travel of the pickup head can be adjusted (e.g., dynamically or on-the-fly) during a sequence of component pickup operations (e.g., by way of dynamically adjusting the linear motor 40's displacement of the pusher arm 42) such that the pickup head 36 is (a) maintained within an intended, predetermined, near-optimal, or optimal vertical travel range during component pickup operations, e.g., regardless of suction tip wear over time, and/or a changed or non-optimal suction tip distal end location resulting from suction tip replacement; and (b) prevented from pressing excessively onto the component 100 during the component pickup process.

Figure 7:
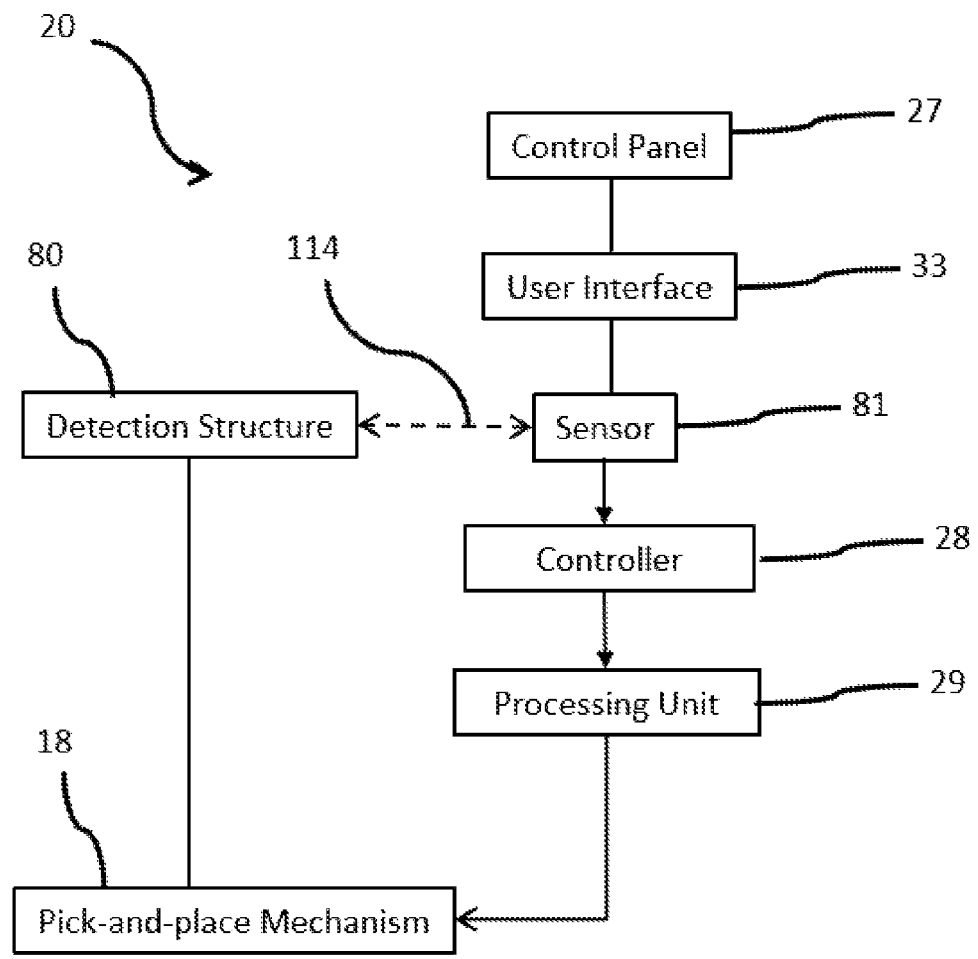
FIG. 7 is a schematic block diagram of an automatic compression threshold setting mechanism.

FIG. 7 is a schematic block diagram of an automatic pickup head vertical position calibration and monitoring, estimation, determination, and/or adjustment subsystem or mechanism in accordance with an embodiment of the present disclosure. The reflector/marker 80 can constitute a part of the pickup head 36 as set forth above mechanism. Upon capture of illumination reflected by the reflector/marker 80, the sensing subsystem 20 can communicate with the controller 28, which includes a processing unit 29 configured for executing program instructions (e.g., memory-resident program instructions) that when executed, it analyzes the signals output by the laser sensor and/or process the images captured by the camera to estimate or determine the first and/or second gap heights at one or more times or as a function of time (e.g., on a repeated, near-real time, or real-time basis) to thereby estimate or determine the current or maximum displacement of the spring guide holder 56 relative to the pickup head housing 54 during one or more component pickup operations. The computed first gap height 106 and/or second gap height 110 can further be converted by the controller 28 to an estimate or measurement of compressive force exerted upon the component by the pickup head spring. A series of signals can thereafter be generated (e.g., by way of controller execution of program instructions) to move or adjust the vertical travel of the pickup head to either (i) automatically calibrate or recalibrate the home position prior to operation or further operation of the pick-and-place mechanism 18, and/or (ii) automatically detect and monitor whether insufficient or excessive force is applied to any components 100 during component pickup operations. The second gap height 72 at a given time as indicated by reflected illumination signal intensity and/or detected marker indicia can be mathematically correlated with the first gap height 70 and/or the force exerted upon the component pickup surface by the pickup head spring 60 at that time, in accordance with conventional mathematical operations in a manner readily understood by individuals having ordinary skill in the relevant art.

A non-limiting example of an auto calibration is described for the subsystem of FIG. 7. For example, a pickup head vertical travel and home position auto-calibration process is described. Trial and error calibration sequence(s) which is manually conducted by a technician is eliminated, such that setting the home position can be entirely performed automatically. In an embodiment, the laser sensor/camera 81 is switched on via a user interface 33 or a "home" switch/GUI on a control panel 27 can be activated after the pickup head 36 is positioned over the component 100. The laser sensor/camera 81 is now able to detect the reflector/marker 80, and the home position can then be determined automatically.

Figure 8:
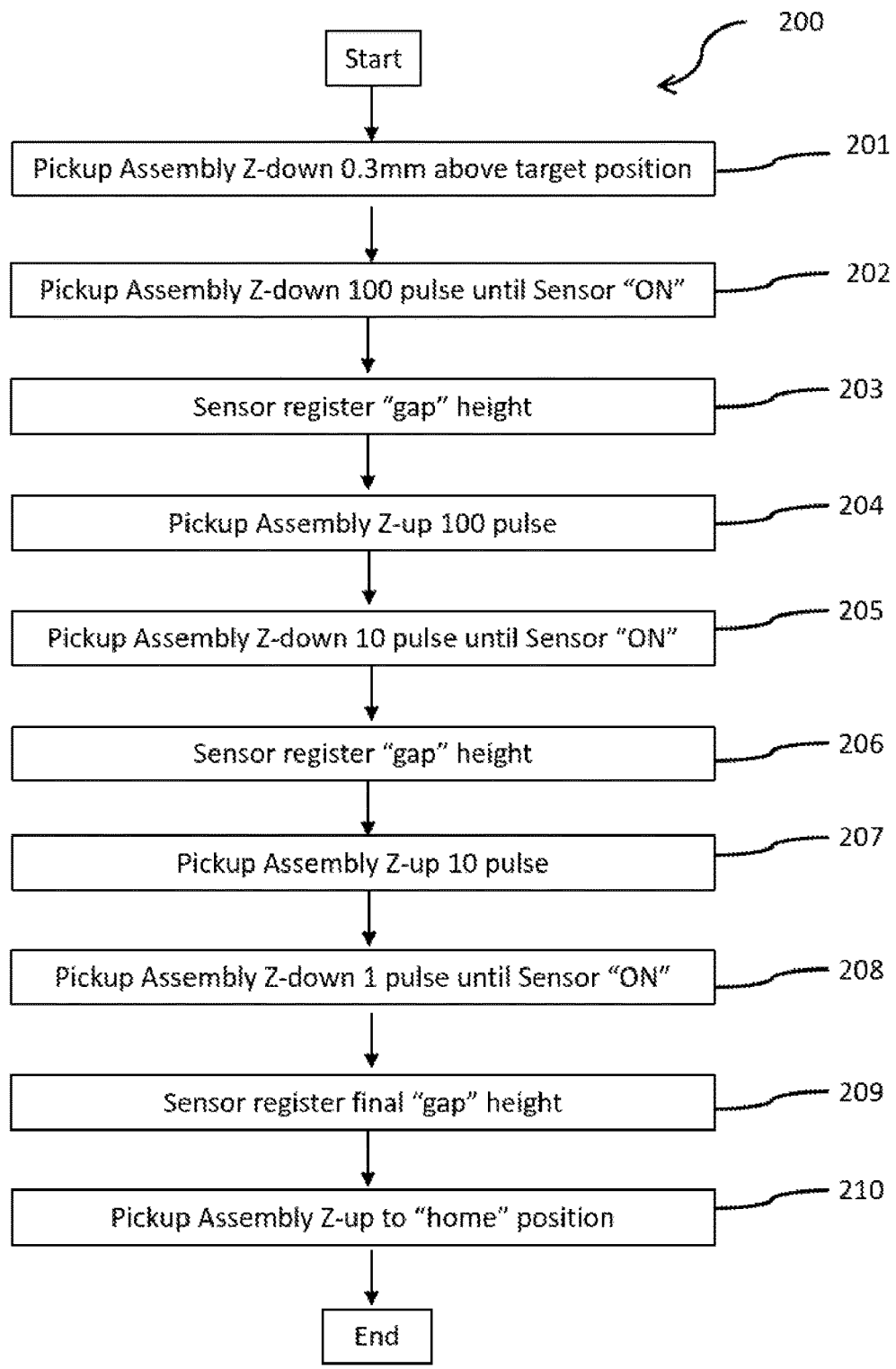
FIG. 8 is a process flow diagram of a non-limiting example of an auto-calibration process.

A non-limiting representative procedural home position calibration sequence 200 is illustrated in FIG. 8 for the subsystem, such as that shown in FIG. 7. For example, a fine vertical positioning increment of the pickup head 36 that occurs in response to the application of a single electrical pulse to the linear motor 40 (e.g., voice coil) corresponds to a predetermined vertical travel increment, for instance, of 1 micron.

In Step 201, pickup head Z-down movement occurs to dispose the pickup head 36 at an initial vertical position, which is an expected, estimated, or measured/known vertical distance such as 0.3 mm above target component pickup position. In Step 202, pickup head Z-down in 100 pulse increments (100 pulses=100 microns in this non-limiting representative example) until sensor registers as "ON" as a result of detecting illumination reflected from the reflector/marker 80 meeting or just exceeding a minimum illumination threshold detection level (e.g., as a result of the second gap 72 attaining a corresponding threshold second gap height $110_{max}$).

In Step 203, controller 28 registers current pickup head height. In Step 204, pickup head Z-up 100 pulses. In Step 205, pickup head Z-down in 10-pulse increments, until Sensor "ON" as above. In Step 206, controller registers pickup head height. In Step 207, pickup head Z-up 10 pulses. In Step 208, pickup head Z-down in 1-pulse increments until Sensor "ON" as above. In Step 209, controller 28 registers current pickup head vertical position as target vertical component pickup position. In Step 210, pickup head Z-up (i.e., vertically displaced upward) across a predetermined distance or by a predetermined number of pulses to establish home position (e.g., such that a tip of the pusher arm 42 configured for imparting force upon the Z-shaft 44 to downwardly displace the Z-shaft 44 resides just above the upper end of the Z-shaft 44).

Such an automated or automatic calibration sequence can be performed at least once, and can be repeated any number of times, to establish or re-establish a calibrated component pickup position and a corresponding calibrated home position, which are consistently reproducible at an accuracy to within 1.0-3.0 microns (e.g., approximately 1.0 micron), which is not possible through a conventional manual calibration procedure.

Upon calibrating the "home' position, the pick-and-place mechanism 18 is ready to perform component pickup operations as part of component pick-and-place operations. Further to the foregoing non-limiting representative examples, an automatic pickup head monitoring, measuring, and adjustment process is described, for example, using the subsystem FIG. 7.

Figure 9:
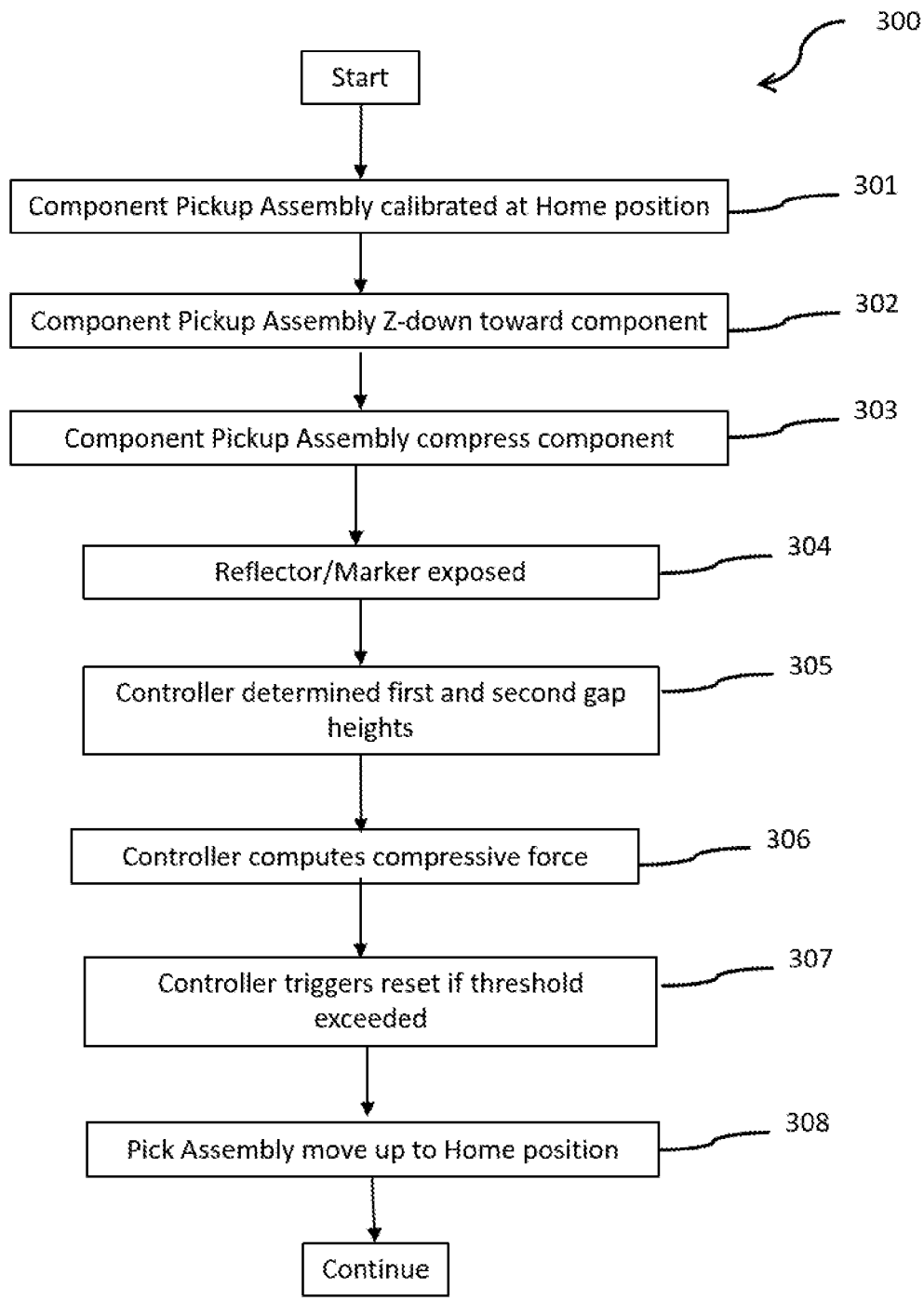
FIG. 9 is a process flow diagram of a non-limiting representative example of a pickup head position monitoring/adjustment process.

A non-limiting process 300 is shown in FIG. 9. In Step 301, component pickup assembly or pickup head 36 is disposed at calibrated home position. In Steps 302, 303 and 304, the pickup head is moved in the Z direction away from the home position and towards the component pickup surface 102 to the component pickup position. For example, the component pickup position is reached when reflector/marker 80 is exposed. As a result of detecting illumination reflected from the reflector meeting or just exceeding the minimum illumination threshold detection level (e.g., as a result of the second gap attaining a corresponding threshold second gap height), sensor 81 is "ON".

In the case where component 100 is carried on a rigid, non-vertically deformable component support surface, a vacuum or suction force is turned on through the suction tip 52 at a sufficient level to overcome any opposing vacuum or suction force retaining the component 100 on the component support surface. This draws the component 100 upward away from component support surface to the suction tip 52 and establishing secure engagement between the suction tip 52 and the component pickup surface 102.

In the case where component 100 is carried on a sticky or vertically deformable surface such as an adhesive tape supported by a film frame, pickup head moves downwards in the Z direction and continues until reflector/marker 80 is exposed. The sensor 81 registers a reflected illumination intensity corresponding to a target second gap height range or height, which is correlated with or corresponds to a target separation distance range or distance between the bottom portion of the spring guide holder 56 and the housing 54, thereby indicating compressive engagement between the suction tip 52 and the component pickup surface 102 has been reached and compressive force falls within or is at a target compressive force range or level, respectively, after which vacuum or suction force is turned on to securely maintain engagement between suction tip 52 and component pickup surface 102.

In Step 305, based on signal communication with the sensor 81, controller 28 determines or records the current pickup head vertical position, the current sensor signal level, and the current first and/or second gap heights. In Step 306, controller 28 computes the current compressive force exerted by pickup head spring 60 on the component 100 based on current pickup head vertical position, current first and/or second gap heights, and pickup head spring parameters. In Step 307, if necessary, controller 28 increases or decreases pickup head Z-down to ensure a minimum threshold compressive force exerted by the pickup head spring 60 on the component 100 is reached or a maximum compressive force exerted by the pickup head spring 60 on the component is not exceeded, respectively, e.g., on a dynamic basis or on-the-fly.

In Step 307, further if necessary, controller 28 determines an adjusted home position or establishes a recalibrated home position, e.g., on a dynamic basis or on-the-fly during the current component pickup operation or prior to a next component pickup operation, based on current pickup head vertical position and current sensor signal output indicating current second gap height at which the minimum threshold compressive force exerted by the pickup head spring 60 on the component 100 is reached or the maximum compressive force exerted by the pickup head spring 60 on the component 100 is not exceeded. In Step 308, pickup head returns to its original or the adjusted home position, from which a subsequent, next, or successive component pickup operation can begin to continue a sequence of component pick-and-place operations.

In the above description, non-limiting representative example systems, subsystems, apparatuses, devices, and processes in accordance with particular embodiments of the present disclosure have been described. It will be readily understood by a person having ordinary skill in the relevant art that various modifications can be made to specific forms, arrangements, and/or structures of the embodiments described above, without departing from the scope of embodiments in accordance with the present disclosure.

What is claimed is:

1. A system for calibrating a vertical position of a component pickup assembly in accordance with a predetermined threshold compressive force exerted on a component by a carrier or support surface during a component retrieval process, the system comprising:
   a sensor;
   the component pickup assembly comprising a reference structure, a housing, and a spring guide holder coupled to a suction tip and a resilient member residing within the housing and reference structure such that the spring guide holder and the housing are spaced from each other to define a variable first gap therebetween;
   a gate formed by the reference structure and a sheath located on the housing, such that the reference structure is spaced from the housing to define a variable second gap therebetween; and
   a detection structure located within the variable second gap by which a sensor is able to detect portions of the detection structure, wherein a detected portion of the detection structure at the variable second gap is correlated to a variable first gap height and wherein the variable first gap height is correlated to the predetermined threshold compressive force exerted on the component by the carrier or support surface during the component retrieval process.

2. The system of claim 1, wherein a sheath blocks or partially blocks illuminations directed to and reflected from the detection structure from/to the sensor when the sheath is in lines of sight or fields of view of optical travel paths of the sensor.

3. The system of claim 2, wherein an amount or intensity of the illuminations reflected from the detection structure and detected by the sensor is correlated to sizes, dimensions or heights of the variable second gap when the detection structure comprises a reflector and the sensor comprises a laser sensor.

4. The system of claim 2, wherein indicia carried by the detection structure and captured by the sensor is correlated to sizes, dimensions or heights of the variable second gap when the detection structure comprises a calibrated marker and the sensor comprises an image capture device.

5. The system of claim 1, wherein an initial height of the variable first gap is calibrated when the component pickup assembly is at an initial calibrated position, wherein the initial calibrated position of the component pickup assembly is in a closest spatial relationship with a predetermined position of a pickup surface of the component.

6. The system of claim 2, wherein the sheath acts as the gate for providing:
   a fully closed variable second gap position such that the sensor is unable to detect the detection structure;
   a range of partially open variable second gap positions such that the sensor is able to detect the portions of the detection structure; and
   a fully open variable second gap position such that the sensor is able to detect a maximum portion of the detection structure, wherein an opening of the gate from the fully closed variable second gap position to the fully open variable second gap position corresponds to a second gap height which is established to correspond with an allowable or acceptable first gap height.

7. The system of claim 4, wherein the sensor is communicatively linked to a controller for computing the compressive force exerted on the component corresponding to the variable first gap height by way of image processing operations based on an analysis of the amount or intensity of the illumination or size, dimension or height of the detection structure captured by the sensor.

8. The system of claim 7, wherein the controller is further configured to provide an auto-calibration mechanism to:
   position the component pickup assembly within an accuracy of one micron of the initial calibrated position; and
   dynamically adjust a position of a vertical travel of the component pickup assembly such that the component pickup assembly is
      maintained within a predetermined vertical travel range during component pickup operations, and
      prevented from pressing excessively onto the component during the component pickup process.

9. A method of calibrating a vertical position of a component pickup assembly in accordance with a predetermined threshold compressive force exerted on a component by a carrier or support surface during a component retrieval process, the method comprising:
   linking a sensor to a controller;
   providing the component pickup assembly comprising a reference structure, a housing, and a spring guide holder coupled to a suction tip and a resilient member residing within the housing and reference structure;
   spacing the spring guide holder and the housing from each other to define a variable first gap therebetween;
   forming a gate comprising the reference structure and a sheath located on the housing;
   spacing the reference structure from the housing to define a variable second gap therebetween;
   providing a detection structure located within the variable second gap by which the sensor is able to detect portions of the detection structure; and
   correlating a detected portion of the detection structure at the variable second gap that is sized to a variable first gap height, wherein the variable first gap height is correlated to the predetermined threshold compressive force exerted on the component by the carrier or support surface during the component retrieval process.

10. The method of claim 9, wherein the sheath blocks or partially blocks illuminations directed to and reflected from the detection structure from/to the sensor when the sheath is in lines of sight or fields of view of optical travel paths of the sensor.

11. The method of claim 10, further comprising correlating an amount or intensity of the illuminations reflected from the detection structure and detected by the sensor to sizes, dimensions or height of the variable second gap when the detection structure comprises a reflector and the sensor comprises a laser sensor.

12. The method of claim 10, further comprising correlating indicia carried by the detection structure and captured by the sensor to sizes, dimensions or heights of the variable second gap when the detection structure comprises a calibrated marker and the sensor comprises an image capture device.

13. The method of claim 9, further comprising calibrating an initial height of the variable first gap when the component pickup assembly is at an initial calibrated position, wherein the initial calibrated position of the component pickup assembly is in a spatial relationship with a predetermined position of the pickup surface of the component.

14. The method of claim 9, wherein the sheath acts as the gate for enabling:
   a fully closed variable second gap position such that the sensor is unable to detect the detection structure;

a range of partially open variable second gap positions such that the sensor is able to detect portions of the detection structure; and a fully open variable second gap position such that the sensor is able to detect a maximum portion of the detection structure, wherein an opening of the gate from the fully closed variable second gap position to the fully open variable second gap position corresponds to a variable second gap height which is established to correspond with an allowable or acceptable first gap height.

15. The method of claim 14, wherein the resilient member is a spring, the spring is not compressed when the gate corresponding to the variable second gap is in the fully closed variable second gap position, such that no compressive force is exerted on the component by the spring.

16. The method of claim 14, wherein the resilient member is a spring, the spring is not compressible to absorb excess force exerted on the component when the gate is in the fully open variable second gap position.

17. The method of claim 11, further comprising computing the compressive force exerted on the component corresponding to the variable first gap height by way of image processing operations based upon an analysis of the intensity of the illumination or size, dimension or height of the detection structure captured by the sensor.

18. The method of claim 13, wherein a controller is further configured to provide an auto-calibration mechanism to:
position the component pickup assembly within an accuracy of one micron of the initial calibrated position; and
dynamically adjust a position of a vertical travel of the component pickup assembly such that the component pickup assembly is
maintained within a predetermined vertical travel range during component pickup operations, and
prevented from pressing excessively onto the component during the component pickup process.

19. The method of claim 17, further comprising an automatic calibrating method of setting an initial position of the component pickup assembly comprising:
moving the component pickup assembly of the component handling device to dispose the component pickup assembly at a predetermined initial component handling device height by a controller;
activating the sensor;
moving the component pickup assembly downwardly in first incremental pulses until the sensor detects the detection structure;
registering a first component pickup assembly height;
moving the component pickup assembly upwardly in the first incremental pulses;
moving the component pickup assembly downwardly in second incremental pulses until the sensor detects the detection structure;
registering a second component pickup assembly height;
moving the component pickup assembly upwardly in the second incremental pulses; and
establishing a calibrated component pickup assembly height comprising the first and second component pickup assembly heights by the controller, wherein the first and second component pickup assembly heights correspond to a plurality of component pickup assembly heights, and wherein the first incremental pulses are greater in magnitude than the second incremental pulses.

20. The method of claim 19, further comprising a method of automatic monitoring, measuring, and adjusting the calibrated vertical position of the component pickup assembly comprising:
disposing the component pickup assembly at the calibrated component pickup assembly height by the controller;
detecting portions of the detection structure when the component is retrieved;
determining the plurality of component pickup assembly heights based on signal communications between the sensor and the controller;
computing the compressive force by the controller;
adjusting the plurality of component pickup assembly heights according to the predetermined threshold compressive force on the component or establishing a recalibrated component pickup assembly height on a current component pickup operation or prior to a next component pickup operation; and
returning the component pickup assembly to its original height or the recalibrated component pickup assembly height, such that a successive component pickup operation continues a sequence of the component retrieval process.

* * * * *